United States Patent
Highfill, III et al.

(10) Patent No.: US 6,529,073 B1
(45) Date of Patent: Mar. 4, 2003

(54) ACTIVE CONTROL SYSTEM AND AMPLIFIERS INCLUDING DAMPING LOOPS AND POWER SUPPLIES WITH OVER-VOLTAGE PROTECTION PRE-REGULATORS

(75) Inventors: John H. Highfill, III, Cary, NC (US); Matthew K. Ferguson, Erie, PA (US); Jeffrey Cranmer, Holly Springs, NC (US)

(73) Assignee: Lord Corporation, Cary, NC (US)

( * ) Notice: Subject to any disclaimer, the term of this patent is extended or adjusted under 35 U.S.C. 154(b) by 0 days.

(21) Appl. No.: 09/565,726

(22) Filed: May 5, 2000

Related U.S. Application Data

(60) Provisional application No. 60/132,778, filed on May 6, 1999.

(51) Int. Cl.[7] ............................ H03F 21/00; H03F 3/04
(52) U.S. Cl. .................................. 330/207 P; 330/298
(58) Field of Search ............................ 330/298, 207 P

(56) References Cited

U.S. PATENT DOCUMENTS

| | | | |
|---|---|---|---|
| 4,715,559 A | 12/1987 | Fuller | ............................ 244/1 |
| 5,319,514 A | * 6/1994 | Walsh et al. | |
| 5,440,411 A | * 8/1995 | Ahuja | |
| 5,526,292 A | 6/1996 | Hodgson et al. | ............. 364/574 |
| 5,551,650 A | 9/1996 | Southward et al. | ............ 244/54 |
| 5,615,097 A | * 3/1997 | Cross | |
| 5,619,581 A | 4/1997 | Ferguson et al. | .............. 381/71 |
| 5,754,662 A | 5/1998 | Jolly et al. | .................. 381/71.4 |
| 5,802,184 A | 9/1998 | Heath | .......................... 381/71.4 |
| 5,845,236 A | 12/1998 | Jolly et al. | ................... 702/195 |
| 5,884,736 A | 3/1999 | Burdisso et al. | ............ 188/379 |

* cited by examiner

Primary Examiner—Patricia Nguyen
(74) Attorney, Agent, or Firm—Michael M. Gnibus; Robert W. Glatz

(57) ABSTRACT

Over-voltage protection circuits are provided for power supplies that may limit input voltage spikes to a power converter and amplifiers including a damping loop that may damp filter resonance. Active damping systems incorporating the over-voltage protection circuits and/or damping loops of the present invention are also provided which may be particularly advantageous in applications such as aircraft or other vehicle applications where size and power consumption are important design considerations. The over-voltage protection circuit in various embodiments senses AC and/or DC voltage levels above a detection threshold level and momentarily disconnects the voltage input to thereby reduce the maximum voltage level input transients seen by the power converter. A capacitor may be provided to maintain the input voltage to the power converter while the input is switched out. The amplifier circuit damping loop in various embodiments is nested with a control circuit current feedback loop which may compensate for feedback problems such as instability which may result when an inductor-capacitor-inductor (L-C-L) filter is included on the output of the amplifier.

11 Claims, 11 Drawing Sheets

AMPLIFIER OVERVOLTAGE
PRE-REGULATOR BLOCK DIAGRAM

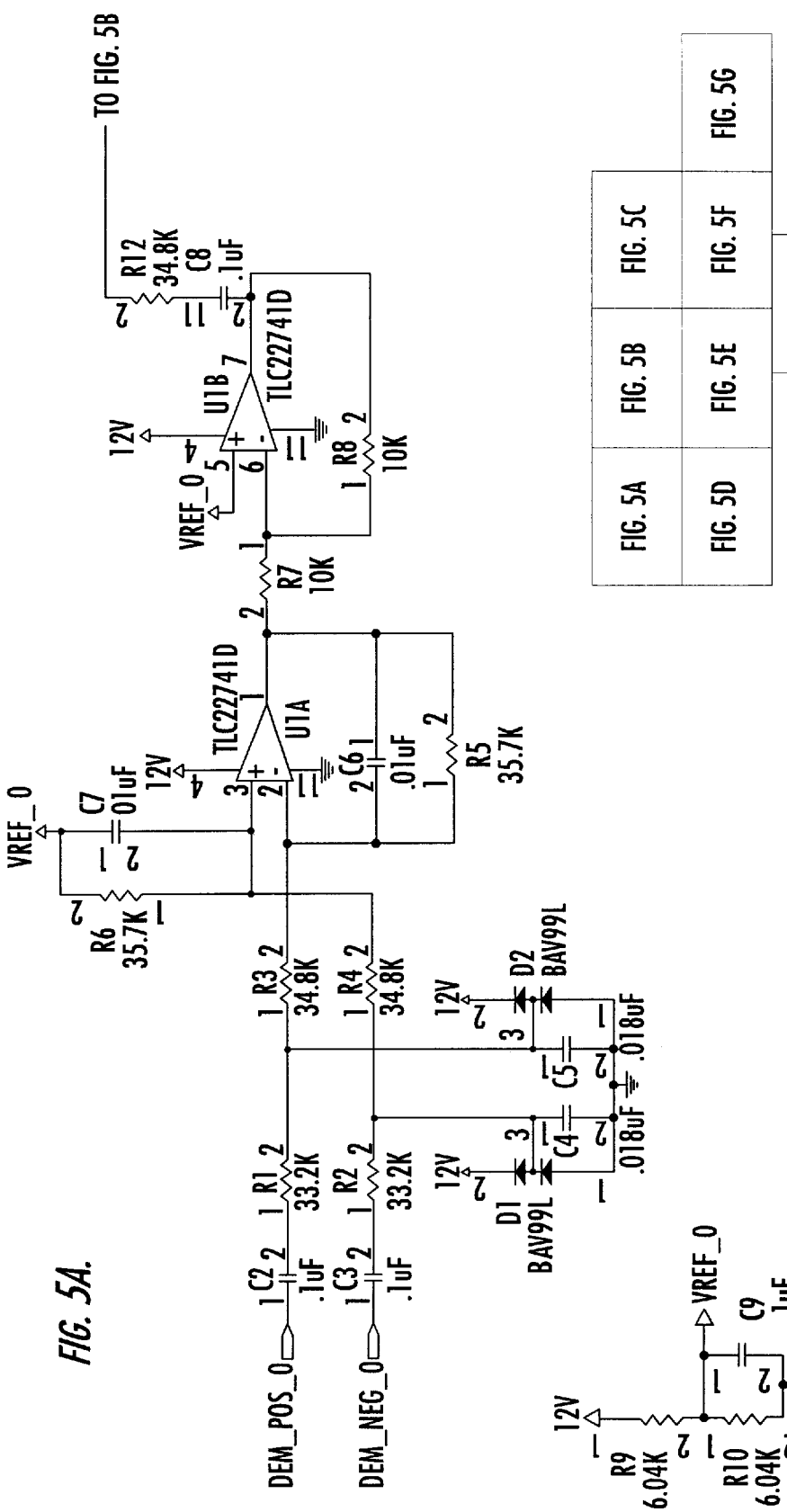

ACTIVE CONTROL SYSTEM AND AMPLIFIERS INCLUDING DAMPING LOOPS AND POWER SUPPLIES WITH OVER-VOLTAGE PROTECTION PRE-REGULATORS

RELATED APPLICATIONS

This application claims the benefit of U.S. Provisional Application No. 60/132,778, entitled "Amplifier Including Over-voltage Protection Pre-regulator and Damping Loop" filed on May 6, 1999, which is hereby incorporated herein in its entirety by reference.

FIELD OF THE INVENTION

The present invention relates generally to voltage regulation in power supplies for electrical circuits, such as in amplifiers. The invention further relates to control of resonance in an electronic circuit, such as an amplifier. More particularly, the invention relates to amplifiers included in active noise and/or vibration control systems.

BACKGROUND OF THE INVENTION

Generic amplifiers are known for use with active noise and/or vibration control systems. Moreover, active noise and/or vibration control systems (e.g., U.S. Pat. Nos. 5,845,236, 5,754,662, 5,619,581, 5,551,650, 5,526,292, 4,715,559) including error sensors, reference sensors, controllers, amplifiers (e.g., U.S. Pat. No. 5,802,184), and inertial actuators (e.g., U.S. Pat. No. 5,884,736) are known.

SUMMARY OF THE INVENTION

The present invention provides over-voltage protection circuits for power supplies that may limit input voltage spikes to a power converter and amplifiers including a damping loop that may damp filter resonance. Active damping systems incorporating the over-voltage protection circuits and/or damping loops of the present invention are also provided which may be particularly advantageous in applications such as aircraft or other vehicle applications where size and power consumption are important design considerations. In various embodiments, the over-voltage protection circuit in various embodiments senses AC and/or DC voltage levels above a detection threshold level and momentarily disconnects the voltage input to thereby reduce the maximum voltage level input transients seen by the power converter. A capacitor may be provided to maintain the input voltage to the power converter while the input is switched out. The amplifier circuit damping loop in various embodiments is nested with a control circuit current feedback loop which may compensate for feedback problems, such as instability, which may result when an inductor-capacitor-inductor (L-C-L) filter is coupled to the output of the amplifier.

In embodiments of the present invention, a power supply includes a voltage source input and a power converter coupled to the voltage source input. A switch is coupled between the voltage source input and the power converter. A controller is coupled to the voltage source input and the switch. The controller opens the switch responsive to detection of a voltage on the voltage source input that exceeds a prescribed limit and closes the switch responsive to detection of a voltage on the voltage source input that does not exceed the prescribed limit to limit over-voltage transients seen by the power converter. The power converter may be a DC to DC converter. The voltage source input may be a DC rail. A capacitor may be coupled between a high side and a low side of the voltage source input.

In further embodiments of the present invention, the voltage source input comprises an AC input and the protection circuit further includes an AC to DC converter coupled between the AC input and the switch. The switch is coupled to the power converter by a DC rail. The controller may be further configured to open the switch responsive to detection of a voltage on the DC rail that exceeds a second prescribed limit to limit over-voltage transients seen by the power converter.

In other embodiments of the present invention, the power supply includes an input voltage sense circuit, having a sense input coupled to the AC input, that outputs an input voltage signal to the controller. The power supply also includes a DC voltage sense circuit having a sense input coupled to the DC rail that outputs a DC voltage signal to the controller. The controller includes a first threshold comparator coupled to the input voltage signal and a second threshold comparator coupled to the DC voltage signal. A switch drive circuit opens and closes the switch responsive to the first and second threshold comparators. A voltage reference signal may be coupled to a reference input of the second threshold comparator and the switch drive circuit may open the switch responsive to the second threshold comparator when the DC voltage signal exceeds the voltage reference signal. The first and second threshold comparators may be hysteretic comparators.

In further embodiments of the present invention, active noise/vibration control systems are provided including at least one reference sensor having a reference signal output representative of a source of disturbance and at least one error sensor having an error signal output representative of a residual disturbance. A controller is coupled to the reference signal output and the error signal output. The controller generates at least one output signal responsive to the reference signal output and the error signal output based on a control method. The control system further includes an amplifier having at least one amplifier channel that amplifies the at least one output signal to provide at least one drive signal. The amplifier includes a voltage source input and a DC to DC power converter coupled to the voltage source input. A switch is coupled between the voltage source input and the power converter. A controller is coupled to the voltage source input and the switch. The controller opens the switch responsive to detection of a voltage on the voltage source input that exceeds a prescribed limit and closes the switch responsive to detection of a voltage on the voltage source input that does not exceed the prescribed limit to limit over-voltage transients seen by the power converter.

In other embodiments of the present invention, an amplifier channel is provided including an L-C filter having an input side and an output side coupled to an output of the amplifier channel. A current loop feedback circuit is coupled between the L-C filter and an input of the amplifier channel. A damping loop is nested within the current loop, the damping loop being configured to dampen resonance from the L-C filter in the current feedback circuit. The L-C filter may be an L-C-L filter. The damping loop may be responsive to a voltage at the output side of the L-C filter or to a main current feedback signal.

In further embodiments of the present invention, the damping loop further includes an amplifier coupled to the main current feedback to provide an active damping loop. The damping loop may also include a differentiating input circuit coupling the main current feedback to the amplifier.

The differentiating input circuit may include a resistor and a capacitor in series. The damping loop may also include a current feedback summer coupled to the input side of the L-C filter and a MOSFET H-bridge circuit coupled between the current feedback summer and the differentiating input circuit.

In other embodiments of the present invention, an over-voltage protection circuit adapted for interconnection to an input power line is provided. The circuit includes a DC rail voltage for powering a power device and an input switch for selective connecting or disconnecting the input power line from the DC voltage rail. A switch drive is operatively coupled to the input switch for opening and closing the switch at commanded times. A comparator compares the input voltage of the input power line or DC voltage rail to a prescribed limit set by a voltage reference and upon exceeding said limit, commanding the switch drive to open the input switch thereby disconnecting the input power line from the DC voltage rail and protecting a power device from over-voltage transients.

DETAILED DESCRIPTION OF THE INVENTION

Figure 1:
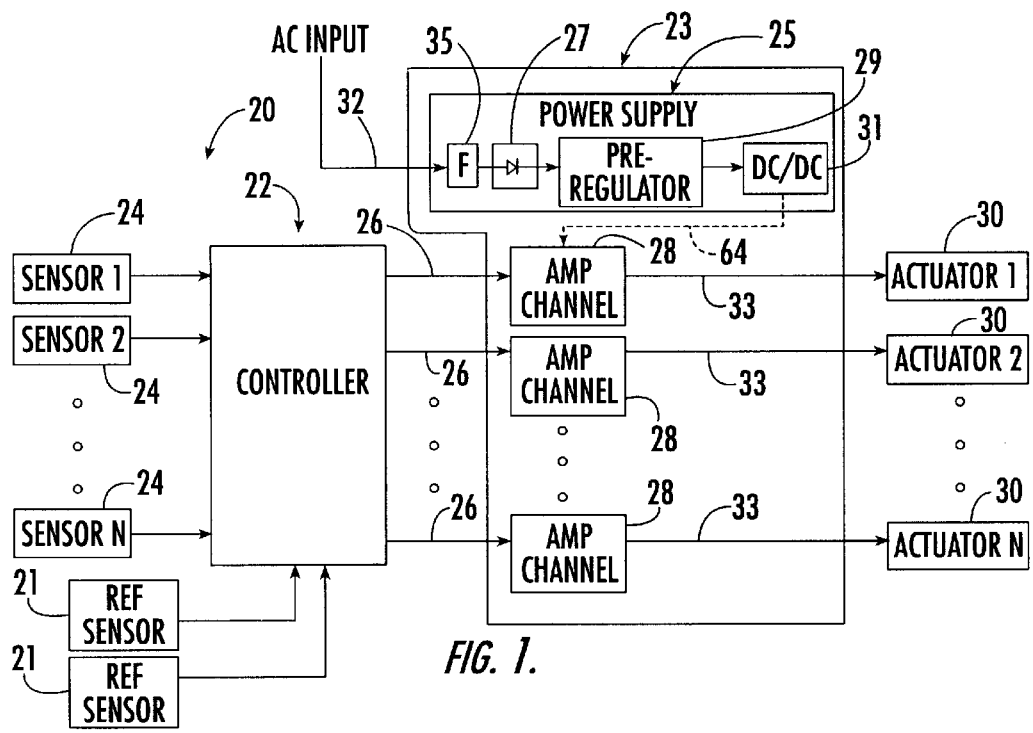
FIG. 1 is a circuit diagram illustrating an active control system including an amplifier according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. In the drawings, layers and regions may be exaggerated for clarity.

Active Noise And/Or Vibration Control System

Embodiments of an active system are shown in FIG. 1 generally at 20 which may be useful, for example, for actively controlling noise in vehicle cabins or other closed structures or for controlling vibration in aircraft or other structures. The active system 20 comprises at least one sensor 24, a system controller 22, an amplifier 23 including one or more amplifier channels, and at least one actuator (e.g., inertial actuator or speaker). The electronic controller 22 receives sensor inputs from the at least one sensor 24, such as microphones or accelerometers or any other suitable sensor. The controller 22 may also receive reference input(s) for example, representative of a tonal disturbance) from a reference sensor(s) 21, such as from an engine(s) tachometer or an accelerometer mounted to a source of disturbance (engine(s)). The controller 22 processes the inputs according to a control method, such as the filtered-x LMS method (e.g., U.S. Pat. No. 5,627,896), and generates at least one output signal 26. The at least one output signal 26 is provided to the amplifier 23 which may include multiple amplifier channels 28.

The amplifier 23 according to embodiments of the present invention may comprise a power supply 25 and one or more (e.g., eight), preferably identical, amplifier channels 28. The amplifier channels 28 output an amplified signal 33 to drive the at least one, and preferably a plurality of actuators 30 (e.g. inertial actuators—otherwise referred to as active tuned vibration absorbers or speakers). The power supply 25 comprises an AC/DC converter, such as a rectifier section 27, a novel over-voltage protection pre-regulator 29 in accordance with a first aspect of the invention, and a power device 31, such as a DC/DC converter. The novel amplifier channel 28 in embodiments of the present invention may be a current feedback system with a class D, or PWM, output stage and includes a resonant output filter and a novel damping loop in accordance with another aspect of the invention to be described later herein.

Therefore, in accordance with a first aspect of the invention a novel pre-regulator 29 is provided in the power supply section 25 that may accommodate the occasional surge voltages present on the incoming power 32. In accordance with a second aspect of the invention, a novel amplifier 28 including a damping loop is provided. The damping loop is preferably nested inside the current feedback loop of the amplifier channel to actively damp the resonance associated with an L-C-L filter in the output network portion of the amplifier circuit 28 driving the actuator 30.

Power Supply Over-voltage Protection Pre-Regulator

Figure 2:
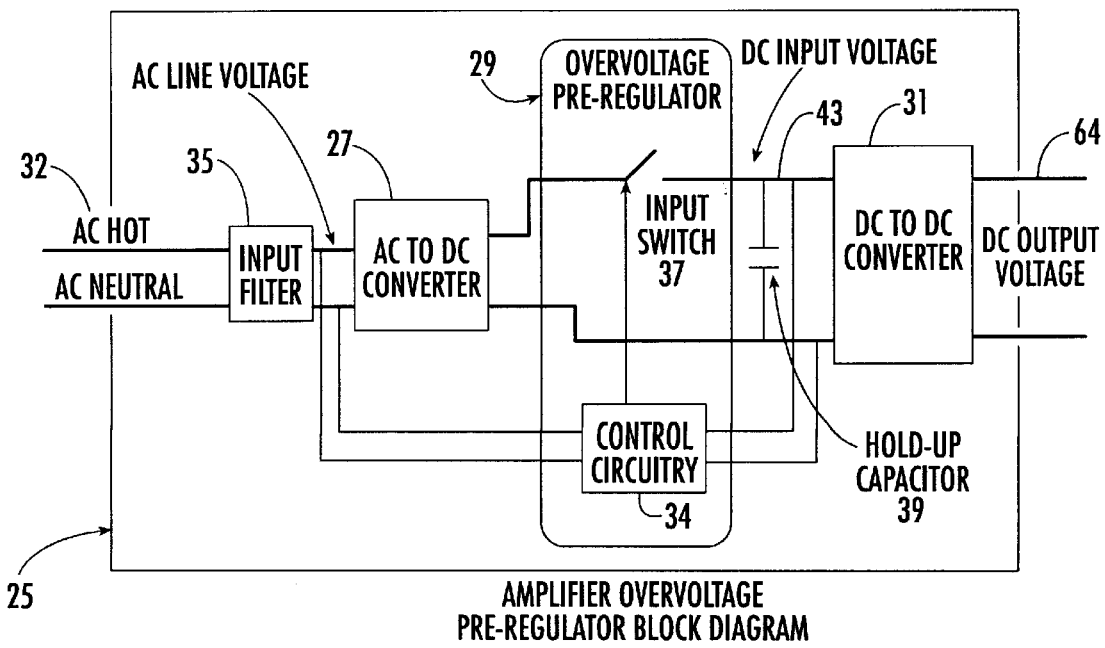
FIG. 2 is a block diagram illustrating a pre-regulator over-voltage protection circuit according to embodiments of the present invention.
Figure 3:
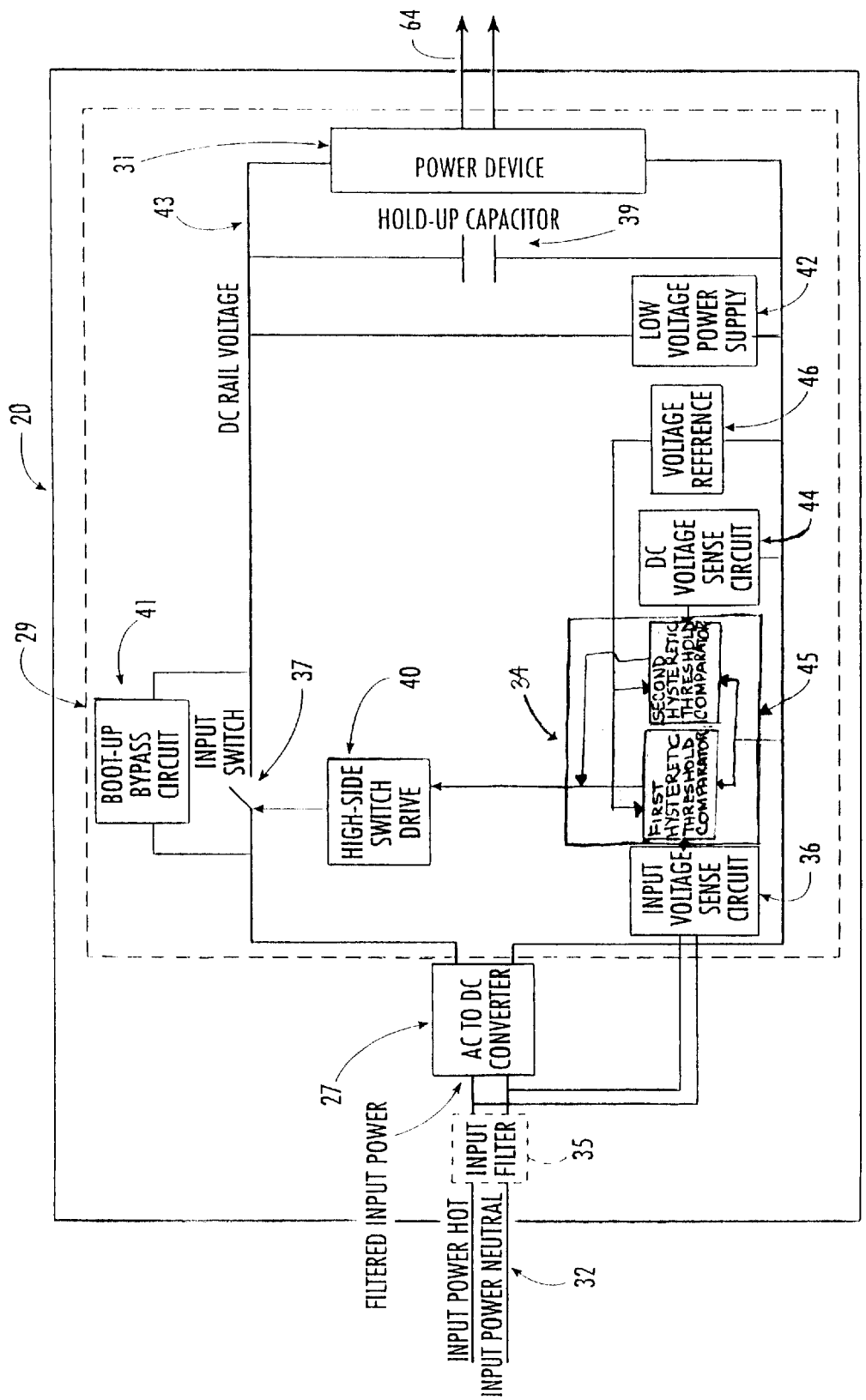
FIG. 3 is a block diagram illustrating a pre-regulator over-voltage protection circuit according to further embodiments of the present invention.

As shown in FIGS. 2 and 3, the pre-regulator over-voltage protection circuit 29 in accordance with embodiments of the present invention may be a low-cost pre-regulator that is intended to protect commercially available or custom power supply 25 and/or power amplifier channels 28 from transient over-voltage conditions that can occur on the incoming power distribution busses. The invention may be applicable to AC or DC input systems. These transient over-voltage conditions can result in DC voltages that exceed the input voltage specifications of power devices (e.g., the DC/DC converter or amplifier channels), and thus may result in either reduced life or catastrophic failure of the devices. In operation, the pre-regulator 29 in accordance with the invention includes a control circuit 34 which senses the input voltage on the AC or DC power bus 32, or both, and will disconnect the line voltage from DC rail voltage at 43 which powers the power device (converter) 31 input until the over-voltage condition clears. Typically a hold-up capacitor 39 on the power device 31 input will continue to feed the power device 31 while it is disconnected from the input supply bus, or until the over-voltage transient condition clears.

The over-voltage pre-regulator 29 may provide a very simple low-cost solution to protect power components from transient over-voltage conditions. Without the over-voltage pre-regulator 29, the power components, such as converter 31, would generally have to be specified to accept higher input voltages. These higher voltage components are often larger, more expensive, or less efficient than lower voltage versions for the same output power rating. The end result is that a power supply 25 or power amplifier which takes advantage of the over-voltage pre-regulator circuit 29 can be less expensive, weigh less, and dissipate less power than a power supply that is sized to handle the specified input voltage transients.

The commercial value of over-voltage pre-regulator circuit 29 is illustrated by the example of the amplifier power supply 25 in the block diagram of FIG. 2. In aircraft systems, for example, the specification for the aircraft AC power bus typically calls out normal AC operating voltages between 97 Vac and 134 Vac. These voltages typically are rectified to a maximum DC voltage of approximately 190 Vdc. Expected AC surge voltages of 180 Vac for 100 mS and 148 Vac for up to one second must be accommodated. This AC input voltage rectifies to a maximum of 255 Vdc.

In one example, the power supply 25 includes commercial off-the-shelf modules manufactured by Vicor Corporation. The power supply included two AIM modules (AC/DC Converter 27) and two VI-25-LU modules (DC/DC Converter 31). Each VI-25-LU module is rated to deliver 200 Watts of output, for a total of 400 Watts of output power at 60 Vdc. The VI-25-LU modules are rated for 200 Vdc of input, and up to 215 Vdc for very short transients by Vicor. Other available modules are rated to handle up to 255 Vdc but these units were only rated to deliver 100 Watts each when provided in the same size package as the VI-25-LU devices. Thus, the cost, size, and weight of the power supply would be increased if the VI-25-LU modules were replaced by these other units. Moreover, the enclosure size would have to be significantly increased to accommodate the large power supply. With the addition of the over-voltage pre-regulator circuit 29 in accordance with the invention, the higher power density modules may be used, with the associated potential savings in cost, weight, and volume. It is to be understood, however, that the over-voltage conditions described here are general problems for many applications and are not just limited to aircraft or aerospace nor is the present invention.

Another example of the utility of this invention can be taken from the power supply/power amplifier system for another inertial actuation system. The amplifier for the inertial actuation system is required to deliver up to 1200 Watts through a four channel switching amplifier. The power supply is a simple three phase half wave rectified arrangement. In this case the amplifier is a switching amplifier manufactured by Apex Microtechnology Corporation. The preferred Apex device is an SA04 module which has a 200 Volt maximum input power rating. Again, the specification on the power bus requires that the unit withstand transient conditions that result in rectified voltages in excess of 200 Volts. Apex modules with higher voltage ratings are less efficient, and the efficiency of the amplifier units may be critical to the success of the performance of the active system. The over-voltage pre-regulator circuit 29 on the rectified DC power rail adjusts the voltage cut-off for the 200 Volt maximum condition.

A block diagram of embodiments of an over-voltage pre-regulator circuit 29 is given in FIG. 3. The over-voltage pre-regulator circuit 29 senses the AC (or DC) line voltage, the DC rail voltage, or both, and opens the input switch 37 if either of these voltages exceed a resistor-programmed limit in the control circuit. The over-voltage pre-regulator circuit 29 is intended to operate during relatively short duration transients. In these cases, the hold-up capacitor 39 may continue to supply the power device (e.g., a DC to DC converter) 31 with power during the transient. Thus, the power supply 25 may continue to function normally during the transient. The output 64 of power device 31 provides power to the various amplifier channels 28.

The illustrated embodiments of the over-voltage pre-regulator circuit 29 includes the following components and inputs/outputs. The pre-regulator 29 receives input power in input line 32. This power input can be an AC voltage (but may be DC as well). An optional line input filter 35 filters the input lines to filter out any high frequency noise present. The line input filter 35 is optional and can be omitted if system requirements permit. An AC to DC converter or rectifier unit 27 receives the output of the input filter 35, if used. This rectifier unit 27 is generally only necessary in systems powered by an AC input voltage and converts the AC input to a DC input. Input voltage sense circuit 36 is configured to sense either instantaneous AC voltages or the DC input power voltage. The circuit 36 generally low-pass filters and divides down the input voltage for a suitable input to the hysteretic threshold comparator 45. The input switch 37, either a field effect transistor (FET), or Bipolar device, is on (closed) during normal circuit operation, and, thus, the over-voltage pre-regulator circuit 29 may be transparent to the operation of the power supply 23. When either the AC input voltage in 32 and/or the DC rail voltage at 43 exceeds a prescribed value, the switch 37 is opened and the input line voltage at 32 is disconnected from the DC rail voltage at 43. Thus, the over-voltage pre-regulator circuit 29 may perform its regulatory function.

The input switch 37 is expected to be the primary power consuming element in the pre-regulator circuit 29. The dissipation of the switch 37 can be reduced by paralleling one or more low resistance devices. In this manner, the pre-regulator 29 can be made to be highly efficient. This switch 37 can also be placed on the other side of the hold-up capacitor 39. In this case, the RMS currents can be reduced through the switch 37 in the AC input case, but the power device 31 may be starved for power during over-voltage transients. A high side switch drive circuit 40 powers the input switch 37 when the DC rail voltage at 43 is high. A boot-up bypass circuit 41 may be used to allow partially charge the DC rail voltage at 43 during power-up conditions. Once the DC rail voltage at 43 reaches a certain voltage, the low voltage power supply 42 powers up and turns the input switch 37 on to allow the DC rail 43 to fully charge. The DC rail voltage at 43 is the main power rail that is being regulated. This power rail 43 powers the power device 31 that is being protected from the high voltage transients. A hold-up capacitor 39 operates as the main storage capacitor (s) for the DC power rail at 43. This capacitor(s) 39 continues to supply power to the power device 31 while the switch 37 is open. The power device 31 can be one or more DC/DC converter(s) (as shown in FIG. 1), one or more power amplifier channels, or other electrical component.

Very often, a lower voltage version of a power device 31 will be less expensive, more efficient, more available, or less bulky or heavy. The over-voltage pre-regulator circuit 29 may allow a lower voltage power device 31 to be used during normal operation and while protecting the power device 31 from transient conditions that might otherwise force the use of a more costly higher voltage power device.

A DC voltage sense circuit 44 senses the DC power rail voltage at 43. The circuit 44 generally low-pass filters and divides down the input voltage for a suitable input to the hysteretic threshold comparator 45. The low voltage power supply 42 powers the small signal circuitry in the voltage sense 44, voltage reference 46, and comparator circuits 45. The low voltage power supply 42 is powered from the DC power rail at 43. The voltage reference 46 provides an accurate voltage reference that is used by the hysteretic comparator circuits 45 to determine the input switch shut-off levels for the power input voltage and the DC power rail. The hysteretic threshold comparators 45 compare the scaleddown input voltage and DC rail voltage to the voltage reference. When the input voltage or DC rail voltage 43 exceeds the resistor programmed limits, the comparator 45 outputs command the high side switch drive circuit to open the input switch 37 to disconnect the power input from the DC rail hold-up capacitor 39. Thus, during transient conditions, the DC power rail may be prevented from exceeding the resistor programmed limits. As a result, the power device 31 may be protected from the over-voltage transient conditions and a lower voltage device can be used which may save cost, weight, size, or reduce power dissipation.

Active Damping Loop

Figure 4:
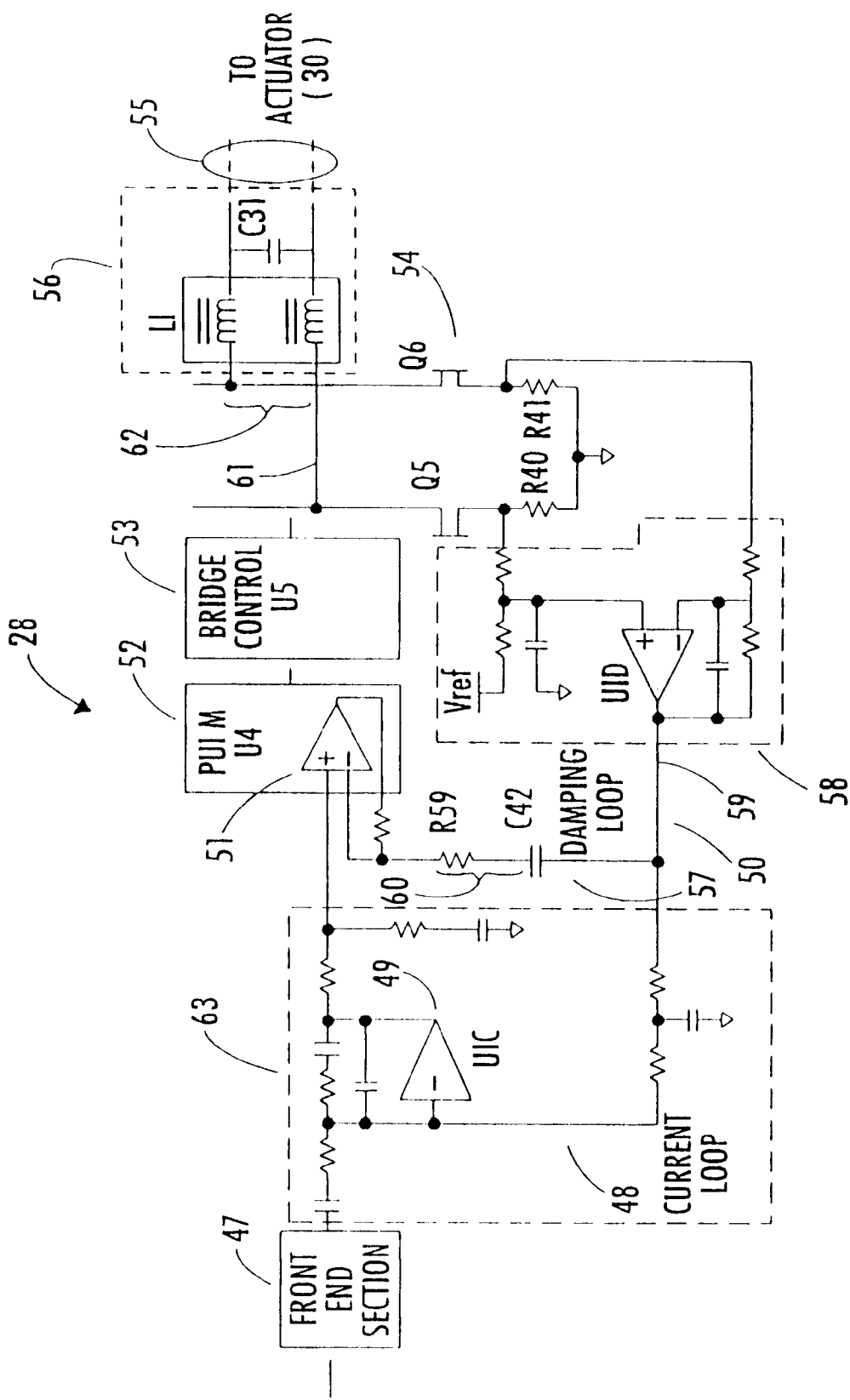
FIG. 4 is a schematic circuit diagram illustrating an amplifier channel according to embodiments of the present invention.
Figure 5B:
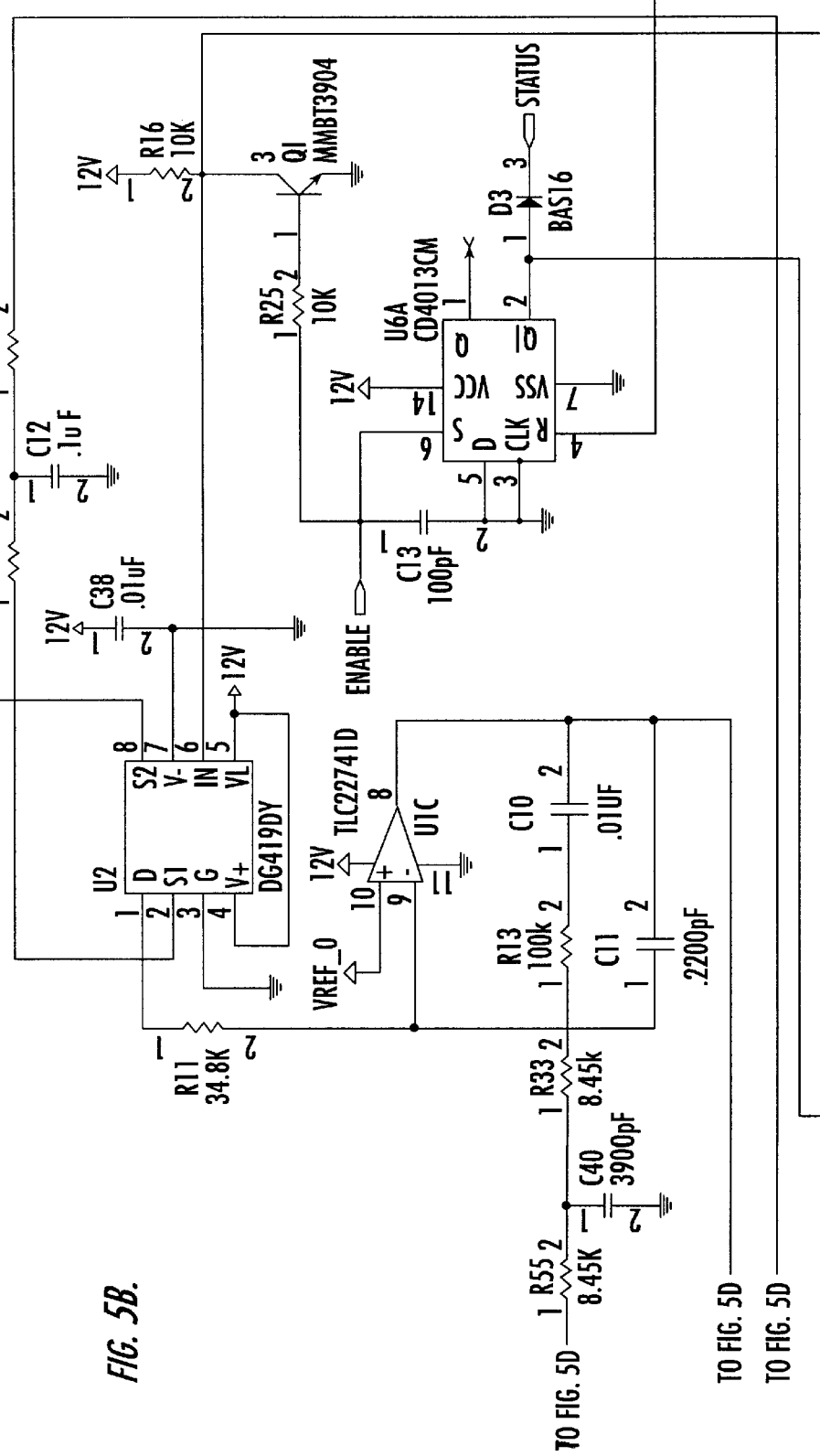
FIG. 5 is schematic circuit diagram illustrating an amplifier channel according to further embodiments of the present invention.
Figure 5C:
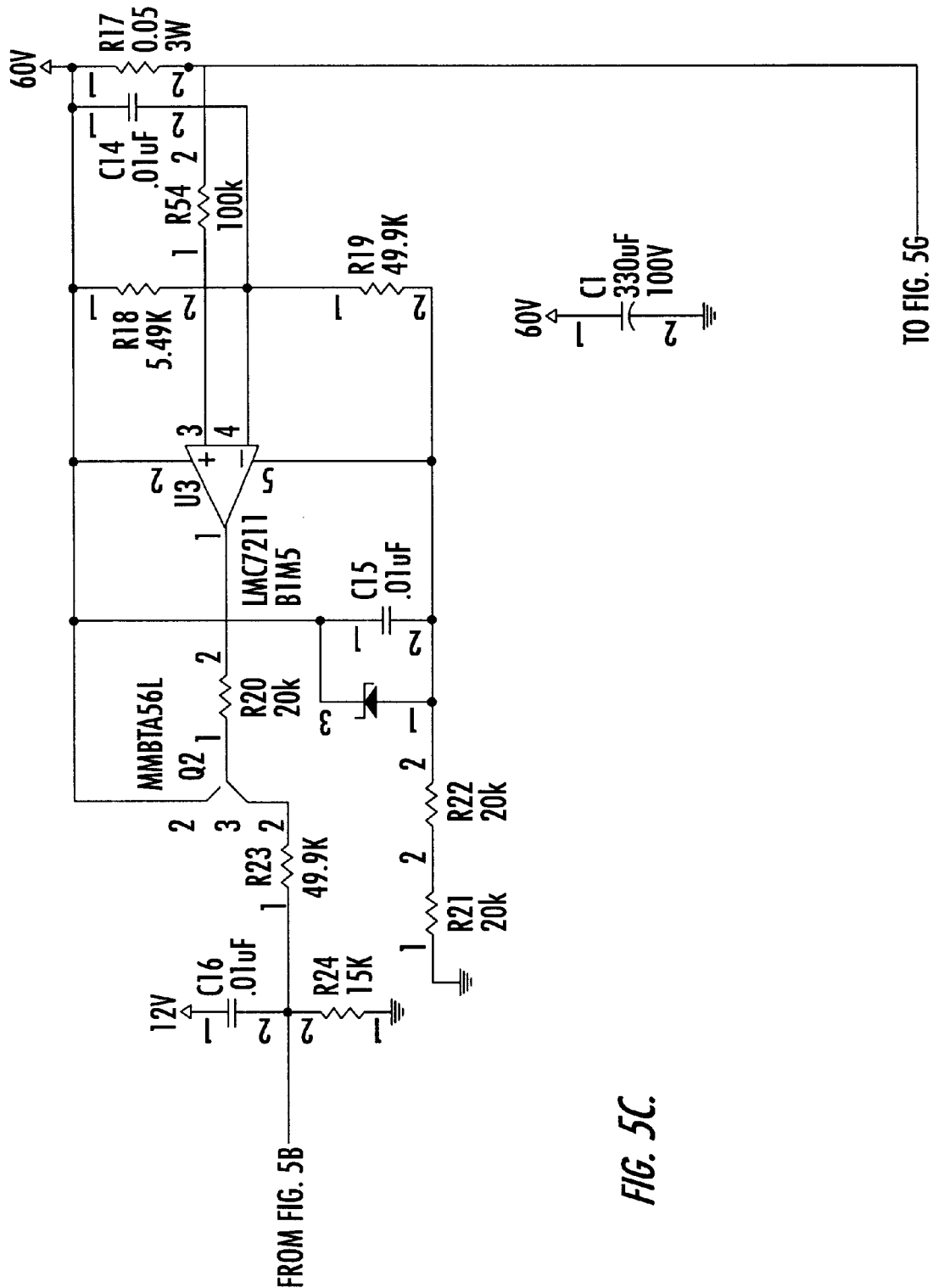
Figure 5D:
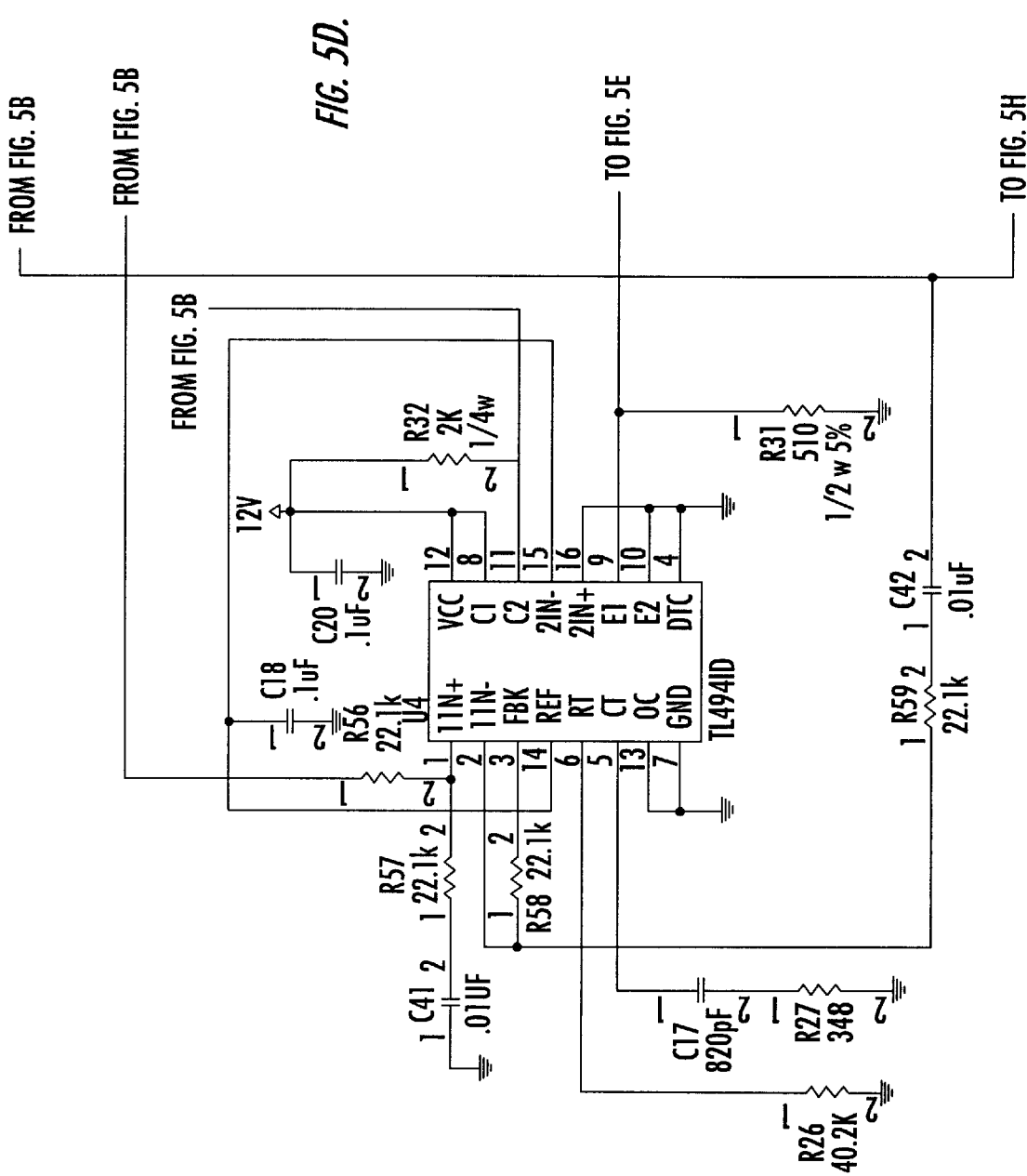
Figure 5E:
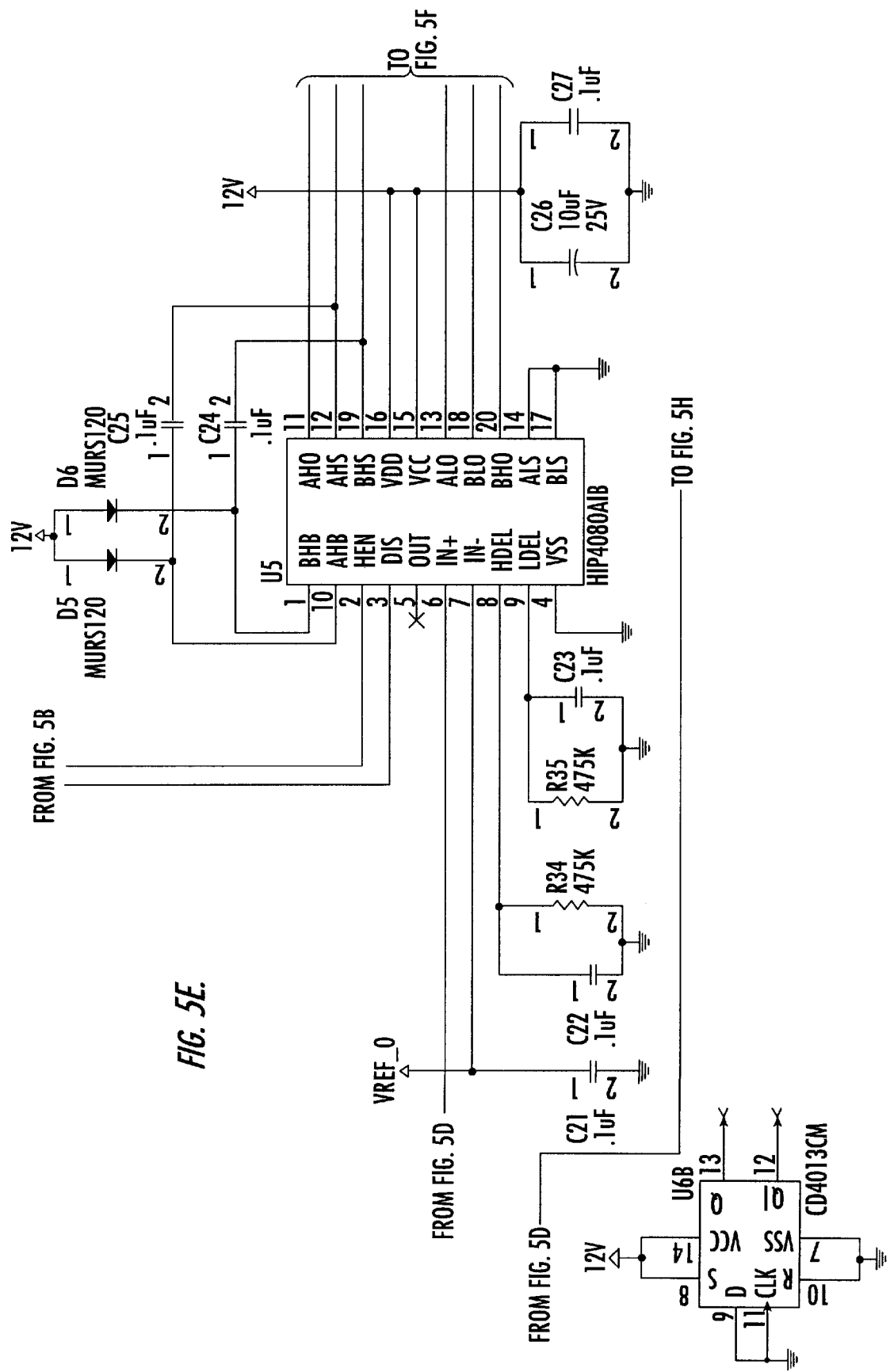
Figure 5F:
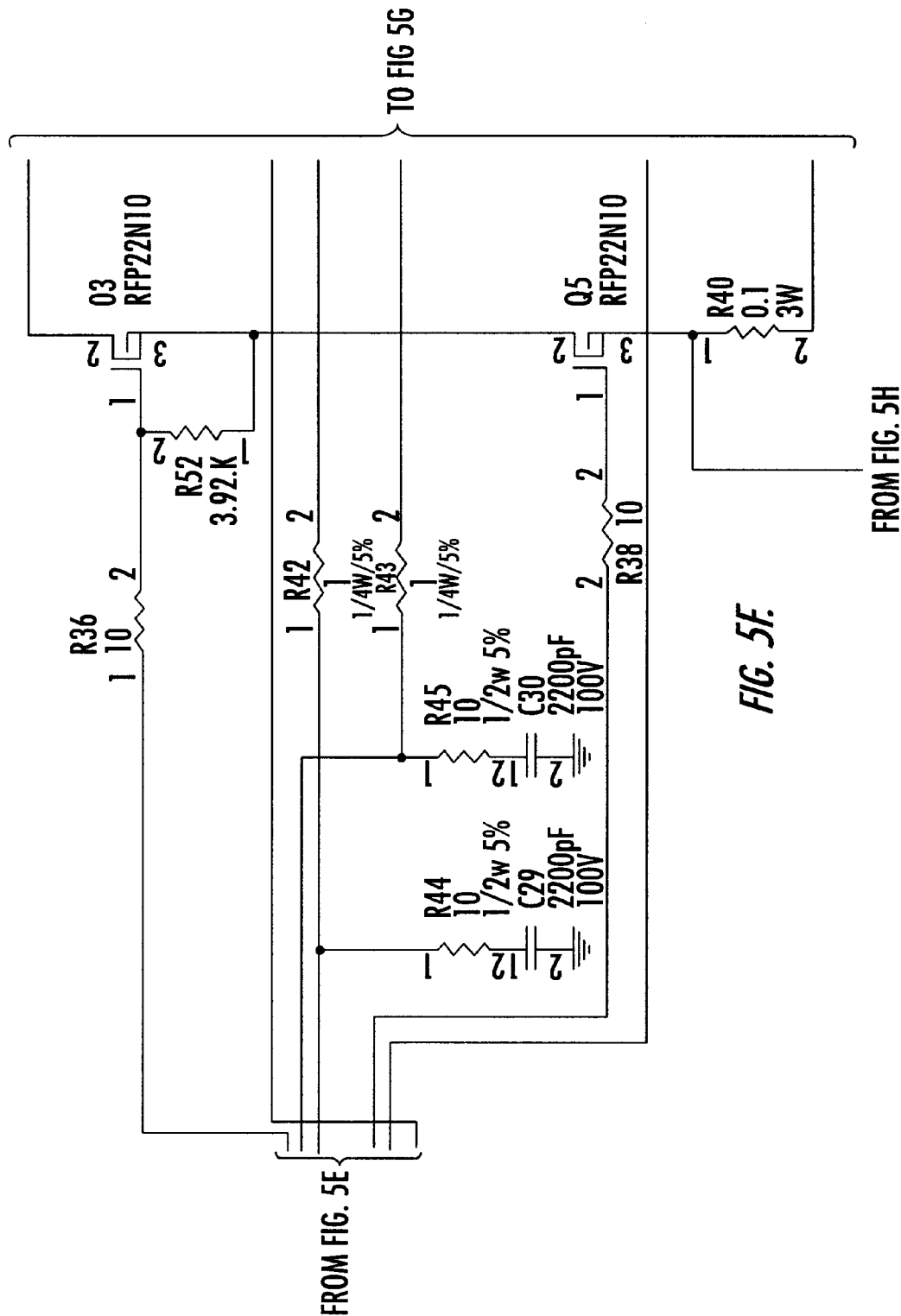
Figure 5G:
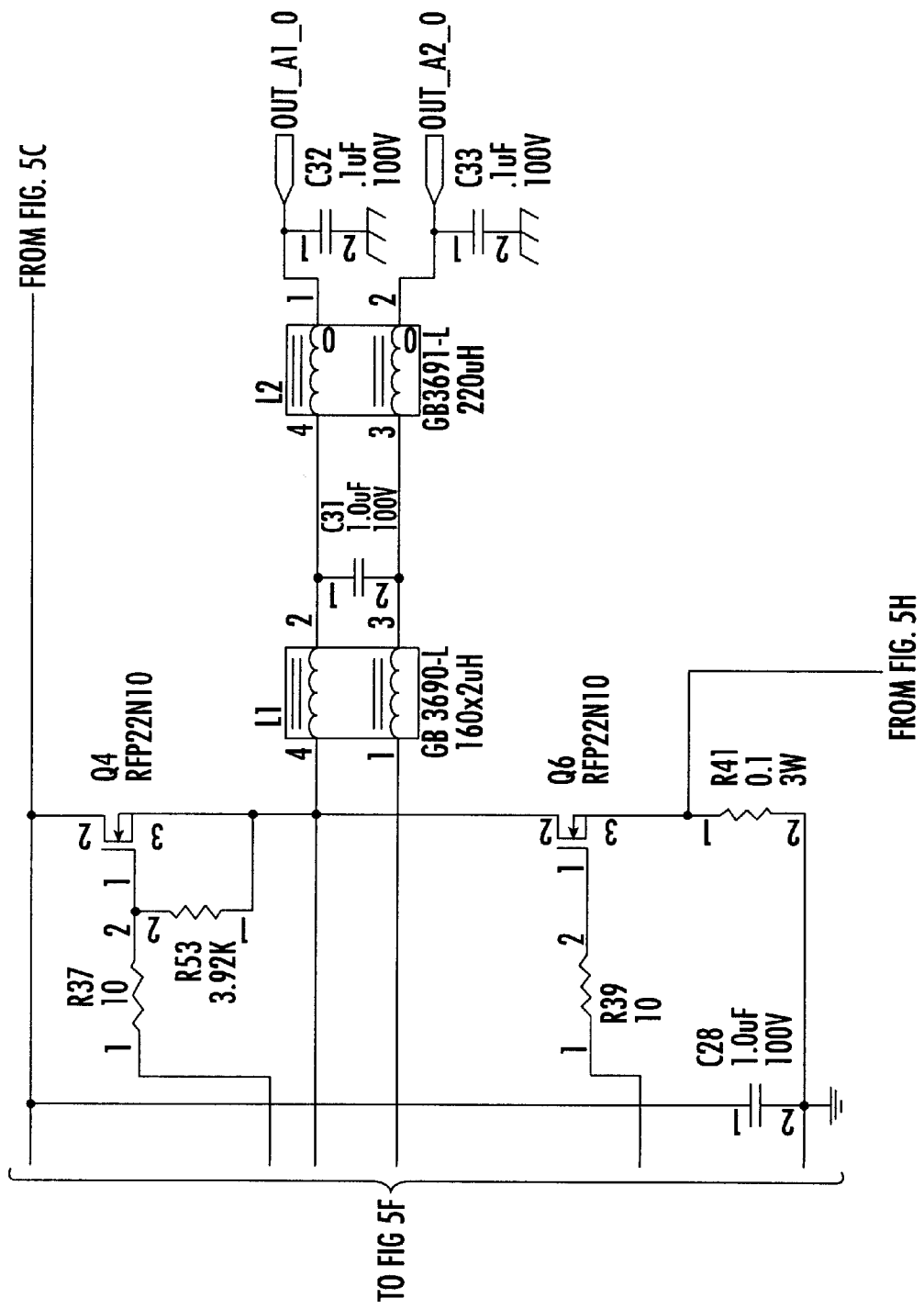
Figure 5H:
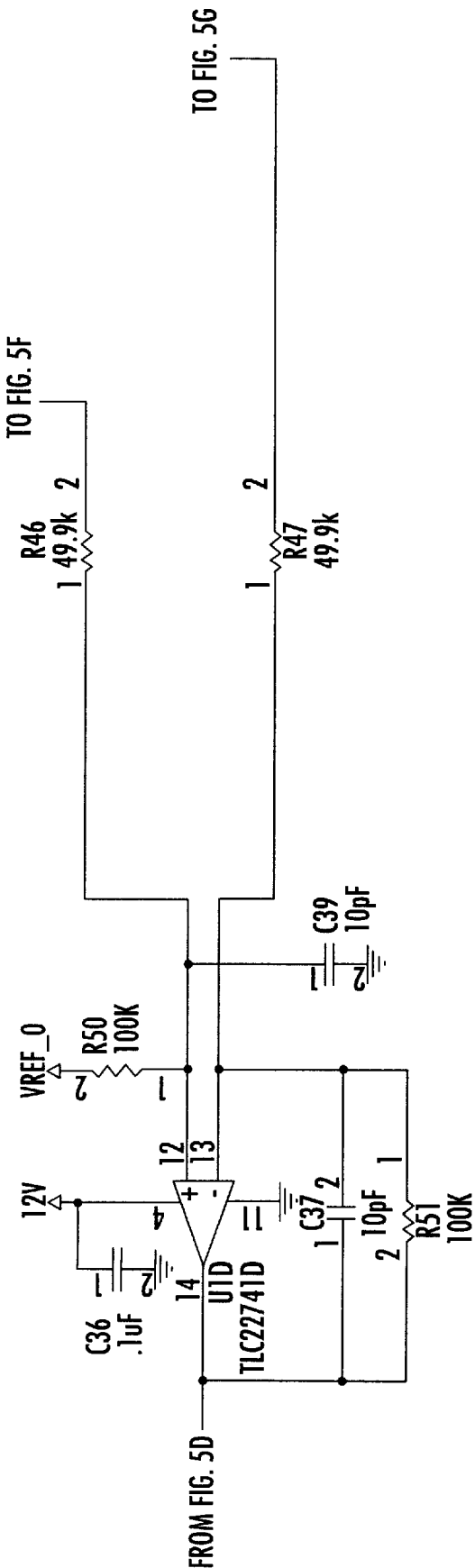

An amplifier channel 28 according to embodiments of the present invention is shown in FIG. 4. An amplifier channel 28 according to embodiments of the present invention is further illustrated in the circuit diagram of FIG. 5. The elements of the amplifier channel 28 as shown in the FIGS. includes a front-end section 47 which conditions the inputs to the current loop 48 which controls the output current to the actuator 30 (FIG. 2), a current loop 48 which includes a current loop closure stage 63 (including an operational amplifier 49) and the damping loop 50, and a damping loop 50 including a damping loop closure stage (an operational amplifier (op amp)) 51 (included on PWM 52 in the illustrated embodiment as an unused op amp was available on PWM 52 in this case), the PWM 52, bridge controller 53, the MOSFET H-bridge 54 (including Q3, Q4, Q5 and Q6 of FIG. 4 and 5), the filter 56, the cable 55, the actuator 30, the resistors R40, R41, current feedback summer 58, and differentiating input circuitry 60.

The damping loop 50 as shown in FIGS. 4 and 5 is nested within the current loop 48. The channel 28 ultimately drives the actuator 30 at the end of a cable 55 attached to the output port 33.

An L-C-L filter 56, comprising inductor L1 (including two very low loss inductors) and capacitor C31 in the schematic of FIG. 4, is typically used on the output of the PWM amplifier for various reasons. It may limit the power dissipation in the load at the MOSFET clock frequency and its harmonics. Second, it may limit the spectrum of the signal sent down the output cable 55, hence controls EMI. Third, it may isolate the MOSFETs from capacitive loading, which may limit internal dissipation.

The inclusion of the L-C-L filter 56 in the amplifier load circuit 28, however, may cause two additional concerns during design of the amplifier channel 28. The first problem is that the inductors (L1) in the L-C-L filter 56 may dissipate power within the amplifier channel 28 due to both copper and core losses in the inductors. Also, since the amplifier channel 28 is a current feedback system, the admittance of the filter 56 may significantly affect the feedback, particularly near the L-C-L series resonance frequency, where the admittance exhibits a complex pole pair and may cause the current feedback loop to approach instability.

Power dissipation in the filter 56 is diminished by the choice of a low-loss core material for the chokes, but this has the concomitant effect of reducing the damping of the series resonance, raising the Q of the L-C-L filter 56 and further exacerbating the current loop stability problem. The more lossless the core, the greater the potential stability problem. From the power dissipation standpoint, however, an infinite-Q resonance, if it could be obtained, would be very desirable.

According to embodiments of the present invention, the high-Q series resonance among the components of the L-C-L filter 56 may be damped electronically without damping losses by using a damping loop 50 nested within the current loop, as this may make the resonance essentially invisible to the loop transfer function of the current loop.

As illustrated in FIGS. 4 and 5, the damping loop feedback 57 (which includes resistor R59 and capacitor C42 and current feedback summer 58) closes the damping loop 50. The main current feedback signal 59 is used for the main current loop 48. Alternatively, the damping loop feedback could be derived from the voltage across the capacitor in the L-C-L circuit 56 (i.e., C31 in the schematic) but this requires additional known circuitry not shown in the FIGS. as will be understood by those of skill in the art.

Frequency compensation of the damping loop 50 may be accomplished with differentiating input circuitry 60 (including R59 and C42 in the schematic) in the damping loop. Support for this result recognizes that the external actuator 30 is essentially a d-c path, in which case the input admittance, Y, to the L-C-L filter 56 with actuator load functions as a low pass second order filter with a high resonant peak at the band edge, i.e., Y has the form:

$$Y(s) = \frac{\omega_o^2}{s^2 + 2\xi\omega_o s + \omega_o^2}$$

where Y(s)=admittance, i.e., the ratio of the input current 61 to the L-C-L filter 56 to the applied voltage 62 across the L-C-L Filter 56, $\omega_o$=the resonant frequency of the L-C-L filter 56, $\xi$=the damping factor of the resonance of the filter 56, and s=the Laplace complex frequency variable.

Closing the damping loop 50 around this function with differentiating compensation of the form, Ks, gives as the denominator of the damping loop closed loop transfer function the following:

Zeros$\{1+KsY(s)\}=s^2+(2\xi+K)\omega_o s+\omega_o^2$ in which, for example, if

K=2(1-$\xi$)

then

Zeros$\{1+KsY(s)\}=s^2+2\omega_o s+\omega_o^2=(s+\omega_o)^2$

With this technique, resonance damping can be changed to critical (two real roots), or other acceptable level. The components C42 and R59 give a differentiating compensation of the form Ks at the frequency $\omega_o$.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A power supply comprising:
   a voltage source input;
   a power converter coupled to the voltage source input, said power converter produces a converted voltage source signal;
   a switch coupled between the voltage source input and the power converter;
   a controller coupled to the voltage source input and the switch that opens the switch responsive to detection of a voltage on the voltage source input that exceeds a prescribed limit and that closes the switch responsive to detection of a voltage on the voltage source input that does not exceed the prescribed limit to limit over-voltage transients seen by the power converter;
   an input voltage sense circuit having a voltage sense input coupled to the voltage source input, the input voltage sense circuit outputs an input voltage signal to the controller;
   a first voltage sense circuit having a first voltage sense input coupled to the power converter, the first voltage sense circuit outputs a converted voltage signal to the controller; and
   wherein the controller comprises:
      a first threshold comparator coupled to the input voltage signal;
      a second threshold comparator coupled to the converted voltage signal; and
      a switch drive circuit that opens and closes the switch responsive to the first and second threshold comparators.

2. The power supply of claim 1 wherein the controller is further configured to generate a switch drive command signal coupled to the switch that opens the switch responsive to detection of a voltage on the voltage source input that exceeds a prescribed limit and closes the switch responsive to detection of a voltage on the voltage source input that does not exceed the prescribed limit to limit over-voltage transients seen by the power converter.

3. The power supply of claim 2 wherein the power converter is a DC to DC converter.

4. The power supply of claim 2 wherein the voltage source input comprises a DC rail.

5. The power supply of claim 2 further comprising a capacitor coupled between a high side and a low side of the voltage source input.

6. The power supply of claim 2 wherein the voltage source input comprises an AC input, the power supply further comprising:
   an AC to DC converter coupled between the AC input and the switch; and
   wherein the switch is coupled to the power converter by a DC rail.

7. The power supply of claim 6 wherein the controller is further configured to open the switch responsive to detection of a voltage on the DC rail that exceeds a second prescribed limit to limit over-voltage transients seen by the power converter.

8. The power supply of claim 7 wherein the power converter is a DC to DC power converter and further comprising a capacitor coupled to the DC rail.

9. The power supply of claim 1 wherein the further comprising a voltage reference signal coupled to a reference input of the second threshold comparator and wherein the switch drive circuit opens the switch responsive to the second threshold comparator when the converted voltage signal exceeds the voltage reference signal.

10. The power supply of claim 9 wherein the first and second threshold comparators are hysteretic comparators.

11. The control system of claim 1 wherein the voltage source input comprises an AC input, the system further comprising:
   an AC to DC converter coupled between the AC input and the switch;
   wherein the switch is coupled to the power converter by a DC rail; and
   wherein the controller is further configured to open the switch responsive to detection of a voltage on the DC rail that exceeds a second prescribed limit to limit over-voltage transients seen by the power converter.

* * * * *